(12) United States Patent
Gwin

(10) Patent No.: US 11,032,944 B2
(45) Date of Patent: Jun. 8, 2021

(54) CRUSHABLE HEAT SINK FOR ELECTRONIC DEVICES

(71) Applicant: INTEL CORPORATION, Santa Clara, CA (US)

(72) Inventor: Paul Gwin, Orangevale, CA (US)

(73) Assignee: Intel Corporation, Santa Clara, CA (US)

( * ) Notice: Subject to any disclaimer, the term of this patent is extended or adjusted under 35 U.S.C. 154(b) by 20 days.

(21) Appl. No.: 15/721,242

(22) Filed: Sep. 29, 2017

(65) Prior Publication Data
US 2019/0104643 A1  Apr. 4, 2019

(51) Int. Cl.
| | | |
|---|---|---|
| *H05K 7/20* | (2006.01) | |
| *F28F 3/02* | (2006.01) | |
| *H01L 21/48* | (2006.01) | |
| *H01L 23/373* | (2006.01) | |
| *H01L 23/367* | (2006.01) | |

(52) U.S. Cl.
CPC ......... *H05K 7/20409* (2013.01); *F28F 3/025* (2013.01); *H01L 21/4878* (2013.01); *H01L 21/4882* (2013.01); *H01L 23/3672* (2013.01); *H01L 23/3736* (2013.01); *H05K 7/20509* (2013.01); *F28F 2275/12* (2013.01)

(58) Field of Classification Search
CPC ... H05K 7/20409; F28F 3/025; F28F 2275/12
See application file for complete search history.

(56) References Cited

U.S. PATENT DOCUMENTS

| | | | | | |
|---|---|---|---|---|---|
| 4,203,490 A | * | 5/1980 | Terai | ......................... | F28F 1/12 165/134.1 |
| 4,317,484 A | * | 3/1982 | Tanabe | .................. | F28F 19/004 165/134.1 |
| 4,410,036 A | * | 10/1983 | Kanada | ................. | F28D 1/0478 165/134.1 |
| 4,716,959 A | * | 1/1988 | Aoki | ....................... | B23K 1/19 165/152 |
| 5,077,889 A | * | 1/1992 | Matsuda | ................. | H05B 3/50 228/180.1 |
| 5,375,655 A | * | 12/1994 | Lee | .......................... | F28F 3/02 165/185 |

(Continued)

*Primary Examiner* — Binh B Tran
*Assistant Examiner* — Michael A Matey
(74) *Attorney, Agent, or Firm* — Hanley, Flight and Zimmerman, LLC

(57) ABSTRACT

A heatsink includes a fin-set that includes a corrugated ribbon having a first, deformable, portion and a second, convective, portion that is not deformed. A plurality of corrugated ribbons may be physically and/or thermally coupled (e.g., via mechanical fasteners, thermally conductive bonding, or reflow) to form the heatsink. A force may be applied to the heatsink sufficient to at least partially crush the first, deformable, portion to conform to an external surface of an electronic device. The heatsink may be physically affixed and thermally coupled to an external surface of the electronic device via mechanical fasteners, thermally conductive adhesives or via reflow of a low-melt temperature layer disposed on an external surface of the heatsink. The crushed portion of the first, deformable, portion conforms to the regular (e.g., planar) or irregular surface profile of the electronic device, beneficially and surprisingly improving thermal performance of the heatsink.

26 Claims, 8 Drawing Sheets

(56) References Cited

U.S. PATENT DOCUMENTS

| | | | | |
|---|---|---|---|---|
| 5,625,229 A * | 4/1997 | Kojima | | F28F 3/025 257/712 |
| 6,328,529 B1 * | 12/2001 | Yamaguchi | | F04D 29/582 257/E23.086 |
| 2004/0000396 A1 * | 1/2004 | Lavochkin | | F28F 1/126 165/150 |
| 2006/0187643 A1 * | 8/2006 | Tsurufusa | | H05K 7/2049 361/704 |
| 2007/0053168 A1 * | 3/2007 | Sayir | | H01L 23/3672 361/718 |
| 2007/0159799 A1 * | 7/2007 | Dando, III | | H01L 23/433 361/709 |
| 2009/0053549 A1 * | 2/2009 | Inukai | | C22C 21/00 428/595 |
| 2009/0193804 A1 * | 8/2009 | Ohno | | F28F 13/18 60/516 |
| 2012/0033381 A1 * | 2/2012 | Matsumoto | | H01L 23/3672 361/697 |
| 2013/0020061 A1 * | 1/2013 | Bergh | | F28D 1/0316 165/166 |
| 2013/0045411 A1 * | 2/2013 | Bauer | | F28F 3/025 429/120 |
| 2013/0213603 A1 * | 8/2013 | Connors | | F28F 3/00 165/76 |
| 2014/0065505 A1 * | 3/2014 | Saito | | H01M 8/04164 429/436 |
| 2014/0069620 A1 * | 3/2014 | Takaswa | | F28F 19/04 165/133 |
| 2014/0177166 A1 * | 6/2014 | Nardi | | H01L 23/3672 361/679.54 |
| 2014/0329109 A1 * | 11/2014 | Takewaka | | B23K 1/0012 428/654 |
| 2015/0017470 A1 * | 1/2015 | Edo | | B23K 1/19 428/654 |
| 2015/0292817 A1 * | 10/2015 | Shimanuki | | F28F 3/025 165/173 |
| 2016/0263703 A1 * | 9/2016 | Eldred | | B23K 26/323 |
| 2016/0324031 A1 * | 11/2016 | Fujiwara | | B32B 9/045 |
| 2016/0348987 A1 * | 12/2016 | Minami | | B23K 1/0012 |
| 2017/0160023 A1 * | 6/2017 | Schiehlen | | F28F 9/0224 |
| 2017/0284748 A1 * | 10/2017 | Bungo | | F28F 13/12 |
| 2018/0299210 A1 * | 10/2018 | Ronacher | | F28F 3/025 |
| 2018/0374714 A1 * | 12/2018 | Stathakis | | H01L 21/56 |
| 2019/0049162 A1 * | 2/2019 | Akaiwa | | F28F 1/02 |
| 2019/0242658 A1 * | 8/2019 | Schiehlen | | F28F 1/126 |

* cited by examiner

CRUSHABLE HEAT SINK FOR ELECTRONIC DEVICES

TECHNICAL FIELD

The present disclosure relates to heat sinks used with electronic devices.

BACKGROUND

In operation, electronic devices generate heat that, if allowed to accumulate, would eventually compromise the operation of the electronic device. The relatively small size of electronic devices further hinders their ability to dissipate heat. The widespread replacement of mechanical hard drives with high capacity solid-state storage devices increases the need for effective and efficient heat dissipation, particularly in small form factor devices such as laptops, portables, tablets, and smartphones. Featuring relatively high data transfer rates when compared to traditional magnetic storage devices, newer solid-state drives have begun using the M.2 interface (a compact card interface that supports high data transfer rate capabilities of modern solid-state drives) under a new Serial ATA (SATA) version 3.2 specification.

M.2 form factor solid-state drives are high capacity and low mass devices, typically weighing in between 3 grams and 12 grams. Because of their relative small size and low thermal mass, M.2 form factor heat sinks are thermally challenged and other devices such as heat spreaders provide limited thermal benefit relative to the heat load presented by the solid-state drive. Given the low mass of most M.2 solid state drives, considerable concern exists on the part of original equipment manufacturers (OEMs) regarding the use of heatsinks on M.2 compliant devices. Since conventional heatsinks often weigh more than the M.2 compliant device to which they are attached, many OEMs have concerns about the effect of the mass of such traditional heatsinks during shock and vibration testing of M.2 compliant devices.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

DETAILED DESCRIPTION

Figure 1A:
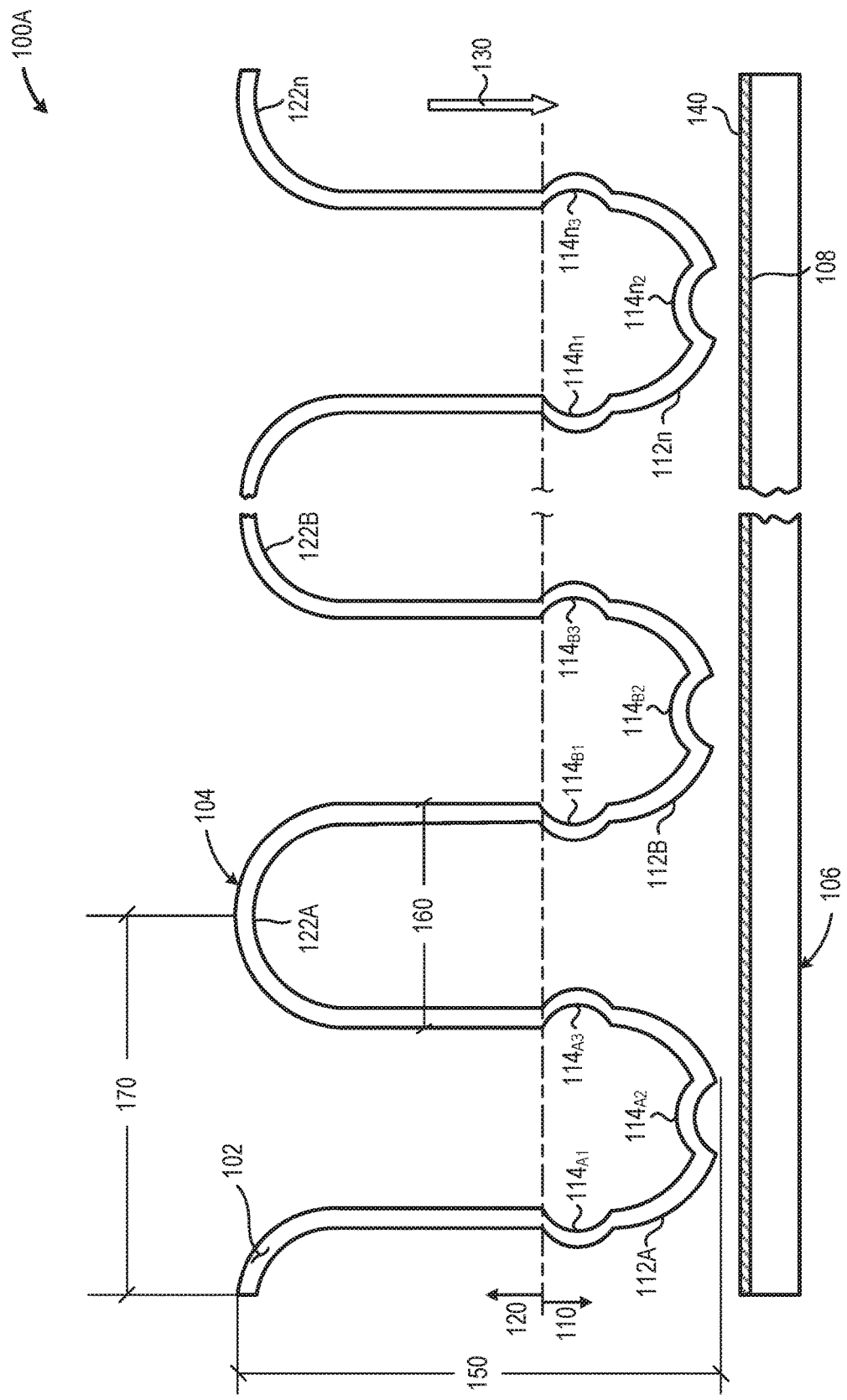
FIG. 1A is a cross-sectional elevation of an example heatsink that includes a thermally conductive material formed into a corrugated ribbon that includes a first, deformable, portion and a second, convective, portion, in accordance with at least one embodiment described herein.

The systems and methods described herein provide an electronic device heatsink that is both light weight and highly efficient. The heatsink disclosed herein includes a thermally conductive corrugated ribbon that preferentially deforms when physically pressed against an electronic device to increase the contact area between the heatsink and the electronic device and to allow contact of differential topography of components, where contact is beneficial. Increasing the contact area between the heatsink and the electronic device improves the heat transfer from the electronic device to the heatsink. The heatsink may include surface features that beneficially and advantageously provide a defined deformation pattern when compressed against an external surface of a housing containing an electronic device, such as a semiconductor die or solid-state drive. The deformation pattern may cause at least a portion of the heatsink to assume a generally planar configuration that may be parallel to the external surface of the electronic device to which the heatsink is attached. Such an arrangement beneficially and advantageously strengthens the heatsink, improving rigidity of the member while imposing no additional weight penalty. The extended heat transfer area provided by the remaining portion of the heatsink beneficially and advantageously improves the overall heat transfer capability of the heatsink, when coupled to the crushable portion which maximizes heat transfer to the fin portion by increased contact area.

A heatsink to dissipate heat generated by an electronic device is provided. The heatsink may include: a corrugated ribbon of thermally conductive material; where the corrugated ribbon includes a plurality first bends at a first angle opposed to a plurality of second bends at a second angle, each of the plurality of first bends thermally coupleable an external surface of an electronic device and each of the plurality of second bends disposed remote from the external surface of the electronic component; and where each of the first bends includes at least one surface feature to facilitate deformation of the respective first bend upon contact with the external surface of the electronic device to provide a thermal contact area proximate the external surface of the electronic device An electronic device is provided. The electronic device may include a housing disposed about the electronic device, the housing including at least one external surface; a heatsink that includes: a corrugated ribbon of thermally conductive material; where the corrugated ribbon includes a plurality first bends at a first angle opposed to a plurality of second bends at a second angle, each of the plurality of first bends thermally coupleable an external surface of the housing disposed about the electronic device and each of the plurality of second bends disposed remote from the external surface of the housing disposed about the electronic device; and where each of the first bends includes at least one surface feature to facilitate deformation of the respective first bend upon contact with the external surface of the housing disposed about the electronic device to provide a thermal contact area proximate the external surface of the housing disposed about the electronic device.

A method of conducting heat away from an electronic device using a heatsink is provided. The method may include deforming a corrugated ribbon of thermally conductive material against an external surface of an electronic device; where the corrugated ribbon includes a plurality first bends at a first angle opposed to a plurality of second bends at a second angle, each of the plurality of first bends thermally coupleable an external surface of an electronic device and each of the plurality of second bends disposed remote from the external surface of the electronic device; and where each of the first bends includes at least one surface feature to facilitate deformation of the respective first bend upon contact with the external surface of the electronic device to provide a thermal contact area proximate the external surface of the electronic device and; thermally coupling the deformed corrugated ribbon to the external surface of the electronic device.

As used herein the terms "top," "bottom," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As used herein, the term "logically associated" when used in reference to a number of objects, systems, or elements, is intended to convey the existence of a relationship between the objects, systems, or elements such that access to one object, system, or element exposes the remaining objects, systems, or elements having a "logical association" with or to the accessed object, system, or element. An example "logical association" exists between relational databases where access to an element in a first database may provide information and/or data from one or more elements in one or more additional databases, each having an identified relationship to the accessed element. In another example, if "A" is logically associated with "B," accessing "A" will expose or otherwise draw information and/or data from "B," and vice-versa.

As used herein, the terms "first," "second," and other similar ordinals are intended to distinguish a number of similar or identical objects and not to denote a particular or absolute order of the objects. Thus, a "first object" and a "second object" may appear in any order—including an order in which the second object appears before or prior in space or time to the first object. Such configurations should be considered as included within the scope of this disclosure.

Note that in the following discussion specific components are designated using an alphanumeric item designator. For example, a first shaft may be designated 110A and a second shaft may be designated 110B. For ease of discussion and conciseness, when describing a feature common to both items, the alphanumeric designator is omitted. Thus, when such a generic (i.e., non-alphanumeric) designator is used, the described feature should be understood as applicable to all items sharing a common numeric designator. For example, a feature described with respect to "shaft 110" would apply to all shafts 110A-110*n*. On the other hand, a feature described with respect to "shaft 110A" would apply specifically to the shaft designated 110A and not to shafts designated 110B through 110*n*.

Figure 1B:
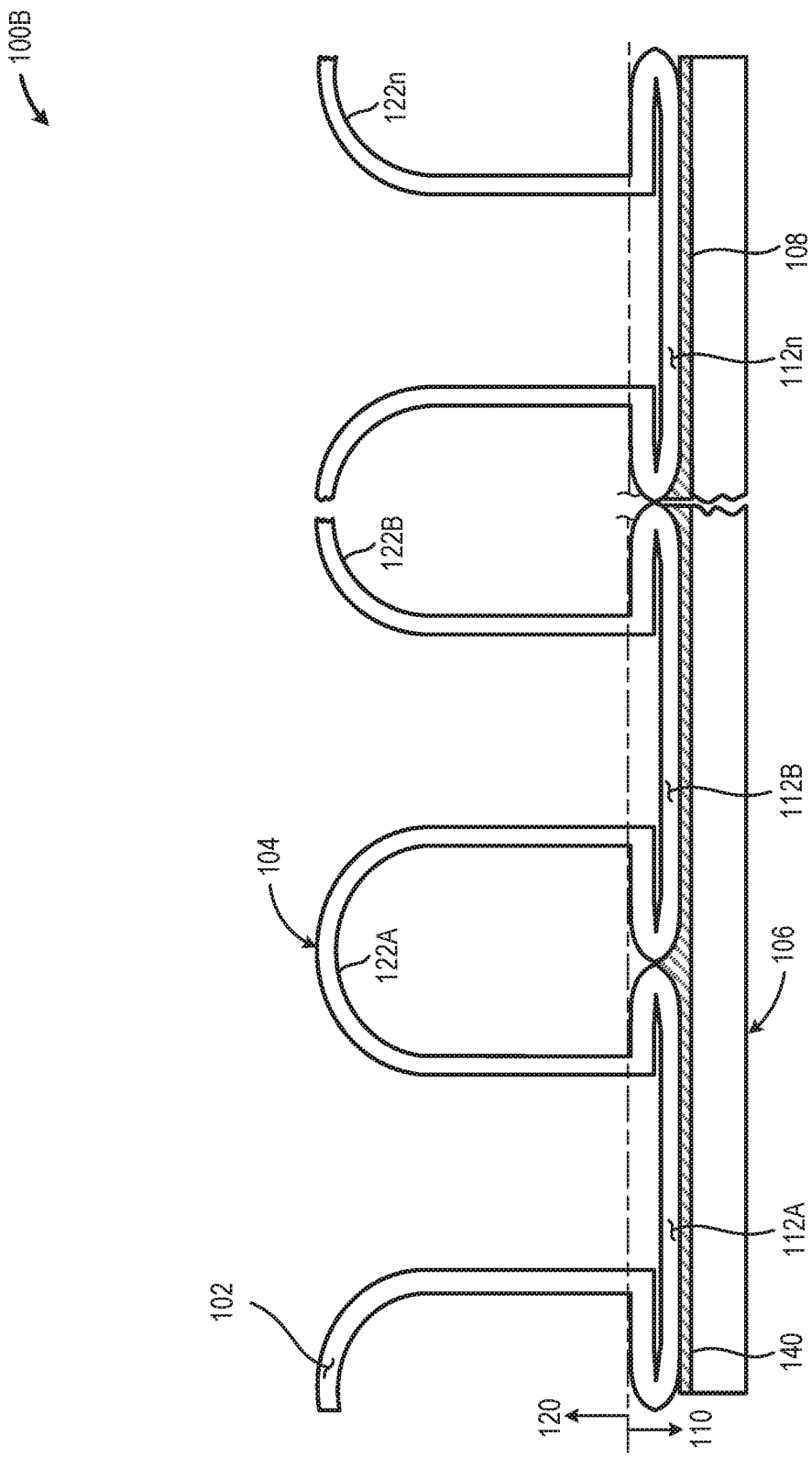
FIG. 1B is a cross-sectional elevation of the example heatsink of FIG. 1A after application of sufficient pressure to distort the first, deformable, portion such that the first, deformable, portion conforms to at least a portion of an exterior surface of an electronic device, in accordance with at least one embodiment described herein.

FIG. 1A is a cross-sectional elevation of an example heatsink 100 that includes a thermally conductive material 102 formed into a corrugated ribbon 104 that includes a first, deformable, portion 110 and a second, convective, portion 120, in accordance with at least one embodiment described herein. FIG. 1B is a cross-sectional elevation of the example heatsink 100 of FIG. 1A after application of sufficient pressure to distort the first, deformable, portion 110 such that the first, deformable, portion 110 falls proximate at least a portion of an exterior surface 108 of an electronic device 106, in accordance with at least one embodiment described herein. In embodiments, one or more thermally conductive adhesives and/or thermally conductive materials 140 may be applied to all or a portion of the external surface 108 of the electronic device 106 to thermally couple the heatsink 100 to the electronic device 106. The thermally conductive material 140 may function as a bonding agent or adhesive that temporarily or permanently bonds and thermally couples the heatsink 100 to the external surface 108 of the electronic device 106.

Referring first to FIG. 1A, the heatsink 100 includes one or more thermally conductive materials 102 formed into a serpentine or corrugated ribbon 104. The corrugated ribbon 104 includes a plurality of first bends 112A-112*n* (collectively, "first bends 112") that form or otherwise provide a first, deformable, portion 110 of the corrugated ribbon. The corrugated ribbon 104 further includes a plurality of second bends 122A-122*n* (collectively "second bends 122") that provide a second, convective, portion 120 that radiates heat generated by an electronic device 106 to a surrounding environment. In implementations, such as depicted in FIGS. 1A and 1B, at least some of the first bends 112 and at least some of the second bends 122 may be formed as a series of constant radius bends in the corrugated ribbon 104. In implementations, such as depicted in FIGS. 1A and 1B, at least some of the first bends 112 and at least some of the second bends 122 may be formed as a series of constant radius arcs of approximately 180°. In other implementations, at least some of the first bends 112 and at least some of the second bends 122 may be formed as a series of constant radius arcs of less than 180°. Upon contact with the external surface 108 of the underlying electronic device 106 and application of sufficient pressure, the first, deformable, portion 110 of the corrugated ribbon 104 crushes, deforms, and/or distorts, allowing the first, deformable, portion 110 to follow at least some of the contours in the external surface 108 of the electronic device 106.

The corrugated ribbon 104 is fabricated using a thermally conductive material 102 that may include any number and/or combination of materials capable of conveying thermal energy (i.e., heat) generated by the electronic device 106 to the ambient environment. In embodiments, the thermally conductive material 102 may include one or more metals and/or metal alloys having a thermal conductivity ("k") of greater than: about 5 Watts/meter-Kelvin (W/m-K); about 10 W/m-K; about 25 W/m-K; about 50 W/m-K; about 100 W/m-K; about 150 W/m-K; about 200 W/m-K; about 250 W/m-K; about 300 W/m-K; or about 350 W/m-K. In embodiments, the thermally conductive material 102 may include at least one metal or metal alloy such as aluminum (k=204 W/m-k @ 20° C.), copper (k=386 W/m-k @ 20° C.), or alloys containing aluminum and/or copper. In embodiments, the thermally conductive material 102 may include a laminated structure having a thermally conductive core fabricated using a relatively high melt-temperature metal or metal alloy (e.g., copper or aluminum, each having a melt temperature of greater than 300° C.) and a thermally conductive outer layer that includes a relatively low melt-temperature metal or metal alloy (e.g., a tin-silver or tin-lead alloy having a melt temperature of less than 230° C.). In some embodiments, the thermally conductive material 102 may include a laminated structure having a thermally conductive core partially or completely coated with a thermally conductive outer layer. In such embodiments, the thermally conductive core portion may be fabricated using a metal or metal alloy having a melt-temperature sufficiently greater than the melt-temperature of the thermally conductive outer layer such that the thermal conductivity of the thermally conductive core and the structure of the thermally conductive core are unaffected by the reflow process used to melt the thermally conductive outer layer to physically and thermally bond the heatsink to the enclosure in which the electronic device 106 will be mounted.

In embodiments, the thermally conductive material 102 is formed into a corrugated ribbon structure 104 such as depicted in FIG. 1A. The corrugated ribbon 104 may be of any dimensions (e.g., length, width, and height). In embodiments, the length and width of the corrugated ribbon 104 may be based, at least in part, on the dimensions of the external surface 108 of the electronic device 106 to which the heatsink 100 will be mounted. In embodiments, the height of the corrugated ribbon 104 may be based, in whole or in part, on the available dimensions within the enclosure in which the electronic device 106 will be mounted. In embodiments, the corrugated ribbon 104 may have a width of less than: about 50 millimeters (mm); about 40 mm; about 30 mm; about 20 mm; about 10 mm; about 5 mm; about 3 mm; about 2 mm; or about 1 mm. In embodiments, the corrugated ribbon 104 may have a height 150 of less than: about 50 millimeters (mm); about 40 mm; about 30 mm; about 20 mm; about 10 mm; or about 5 mm. In embodiments, the corrugated ribbon 104 may have a thickness of less than: about 5 millimeters (mm); about 3 mm; about 2 mm; about 1 mm; about 0.5 mm (500 micrometers, μm); about 0.1 mm (100 μm); about 0.05 mm (50 μm); or about 0.01 mm (10 μm). In embodiments, the corrugated ribbon 104 may have a corrugation width 160 of less than: about 2 centimeters (cm); about 1.5 cm; about 1 cm; about 0.5 cm (5 millimeters, mm); about 0.3 cm (3 mm); about 0.2 cm (2 mm); or about 0.1 cm (1 mm). In embodiments, the corrugated ribbon 104 may have a pitch 170 of less than: about 2.5 centimeters (cm); about 2 cm; about 1.5 cm; about 1 cm; about 0.5 cm (5 millimeters, mm); about 0.3 cm (3 mm); or about 0.2 cm (2 mm).

The thickness of the material used to fabricate the corrugated ribbon 104 may be uniform or non-uniform. The thickness of the material used to fabricate the corrugated ribbon 104 may be based, at least in part, on the thermal performance specifications of the electronic device 106 (heat load, maximum surface temperature, ambient temperature range, etc.). In embodiments, each of the first bends 112 may include a continuous radius bend that extends through a first arc. The first arc may include an arc extending through an angle of from 30° to about 180°. In one embodiment, such as depicted in FIG. 1A, the first arc may extend through an angle of 180°. In embodiments, each of the second bends 122 may include a continuous radius bend that extends through a second arc. The second arc may include an arc extending through an angle of from 30° to about 180°. In one embodiment, such as depicted in FIG. 1A, the second arc may extend through an angle of 180°. The corrugations in the corrugated ribbon 104 may have any physical configuration, thus, although shown as constant-radius curves in FIG. 1A, the corrugations may include, but are not limited to: varying-radius and/or compound curves; sharp-angled corners (e.g., 45° bend, 90° bend, 135° bend), polyhedral curves, polygonal curves, and similar.

The corrugated ribbon 104 may be evenly or unevenly apportioned into a first, deformable, portion 110 that provides an extended surface area for thermally coupling a second, convective, portion 120 of the corrugated ribbon to the external surface 108 of the underlying electronic device 106. The second, convective, portion 120 of the corrugated ribbon 104 remains unchanged (i.e., minimally or not deformed) after the heatsink 100 is thermally coupled to the external surface 108 of the electronic device 106. Each of the first bends 112 included in the first, deformable, portion 110 of the corrugated ribbon 104 may include one or more surface features 114. As depicted in FIG. 1A, first bend 112A includes three surface features $114_{A1}$, $114_{A2}$, and $114_{A3}$ (collectively, "surface features 114"). The surface features 114 facilitate the distortion of the first, deformable, portion 110 of the corrugated ribbon 104 in a defined manner, for example as depicted in FIG. 1B. The surface features 114 may include any size, shape, number, and/or combination of surface features capable of providing a deformation or distortion of the first, deformable, portion 110 in a predictable and generally uniform manner.

Referring now to FIG. 1B, the application of a force 130 to the heatsink 100 causes a permanent deformation or distortion of at least some of the first, deformable, portion 110 of the corrugated ribbon 104. In embodiments, the crushing, deformation, or distortion of at least some of the first, deformable, portion 110 of the corrugated ribbon 104 may occur as the deformable heatsink 100A is compressed against the external surface 108 of the electronic device 106. In other embodiments, the corrugated ribbon 104 may be pre-crushed, pre-deformed, or pre-distorted, for example by compressing the heatsink 100 against a surface, prior to thermally coupling the heatsink 100 to the external surface 108. In embodiments, after deformation or distortion, the first, deformable, portion 110 of the corrugated ribbon 104 may attain a profile similar or identical to the profile of the external surface 108. In some implementations, such as depicted in FIG. 1A, the external surface 108 may be planar and the first, deformable, portion 110 of the corrugated ribbon 104 may attain a planar profile. In other implementations, the external surface 108 may be irregular, containing portions, segments, areas, or regions that are non-planar, curved, parabolic, etc., in which case the first, deformable, portion 110 of the corrugated ribbon 104 may attain an irregular profile similar or identical to the irregular profile of the external surface 108. The distortion or deformation of the first, deformable, portion 110 of the corrugated ribbon 104 may beneficially increase the structural rigidity of the heatsink 100, having increased area moments of inertia in multiple directions. Increasing the structural rigidity of the heatsink 100 may beneficially reduce the structural loading placed on the electronic device 106 by the heatsink 100, particularly in installations involving lightweight electronic devices such as solid-state drives and semiconductor packages.

When compared to a non-deformable heatsink, the ability of the first, deformable, portion 110 of the corrugated ribbon 104 to correspond to or follow the contour of the external surface 108 to which it is thermally coupled increases the available surface area for transferring heat from the electronic device 106 to the second, convective, portion 120. The increased contact surface or heat-transfer area formed by the distorted deformable portion 110 of the corrugated ribbon 104 beneficially improves the heat transfer from the electronic device 106 to the surrounding environment via the second, convective, portion 120 of the heatsink 100. Thus, contrary to conventional finned coil radiators (such as found in automobiles and HVAC equipment), crushing the deformable portion 110 of the corrugated ribbon 104 improves, rather than reduces the heat transfer efficiency of the heatsink 100. The crushable and deformable portion of the heatsink reduces the component hot spot by efficiently spreading heat from the hot spot of the component (i.e. when the crushable portion covers a high percentage of the component surface there is a high probability is contacting the hot spot itself, if the hot spot is not contacted the hot spot will be significantly hotter). A conventional non-crushable sink has minimal coverage and may not thermally coupled to portion of the external surface 108 proximate the hot spot. When compared to non-deformable and/or rigid base heatsinks, the capability for the first, deformable, portion 110 to conform to irregularities in the external surface 108 beneficially and advantages increases the heat transfer from the electronic device 106 to the second, convective, portion 120.

In embodiments, the corrugated ribbon 104 may be combined with a single or multipiece, contoured rigid baseplate. For example, the corrugated ribbon 104 may be physically and thermally coupled to a rigid, thermally conductive, contoured baseplate that follows all or a portion of the external surface contours of a heat producing electronic device 106, such as a semiconductor package. In embodiments, the corrugated ribbon 104 may be pre-crushed to follow the contours of the rigid baseplate prior to being physically and thermally bonded to the baseplate (i.e., the corrugated ribbon is crushed against a contoured buck or mold prior to the physical and thermal bonding process). In embodiments, the corrugated ribbon 104 may be crushed against the contoured, rigid, baseplate during the physical and thermal bonding process.

The heatsink 100 may be thermally coupled to the underlying electronic device 106 using one or more mechanical fasteners, chemical adhesives, or any combination thereof. As depicted in FIGS. 1A and 1B, in some implementations, one or more thermally conductive materials 140 may be disposed in, on, about, or across all or a portion of the external surface 108 of the electronic device 106 prior to thermally coupling the heatsink 100 to the external surface 108. In some implementations, the thermally conductive material 140 may include or otherwise incorporate one or more chemical adhesives capable of both physically affixing or bonding and thermally coupling the heatsink 100 to the electronic device 106. In embodiments, one or more clamps, screws, camlocks, or similar mechanical devices may be used to detachably or non-detachably attach and thermally couple the heatsink 100 to the electronic device 106.

In embodiments, the heatsink 100 may include a low-melt point, thermally conductive, coating or layer (e.g., a layer containing a eutectic alloy of tin and silver) disposed in, on, about, or across at least a portion of the external surfaces of the heatsink 100. In such embodiments, the thermally conductive coating or layer may be reflowed (e.g., in a reflow oven) to physically affix or bond and to thermally couple the heatsink 100 to the electronic device 106.

The heatsink 100 may be thermally coupled to any power consuming and/or heat generating electronic device 106. Example electronic devices 106 include, but are not limited to, solid-state drives (SSDs); semiconductor packages (e.g., central processing units (CPUs), graphical processing units (GPUs)), and similar. In some implementations, the heatsink 100 may be disposed across the entirety of one or more external surfaces 108 of the electronic device 106. In other implementations, the heatsink 100 may be disposed across only a portion of one or more external surfaces 108 of the electronic device 106. The heatsink 100 may be used alone or in conjunction with one or more fluid or air movers that provide a flow of coolant and/or air across the second, convective, portion 120.

Figure 2A:
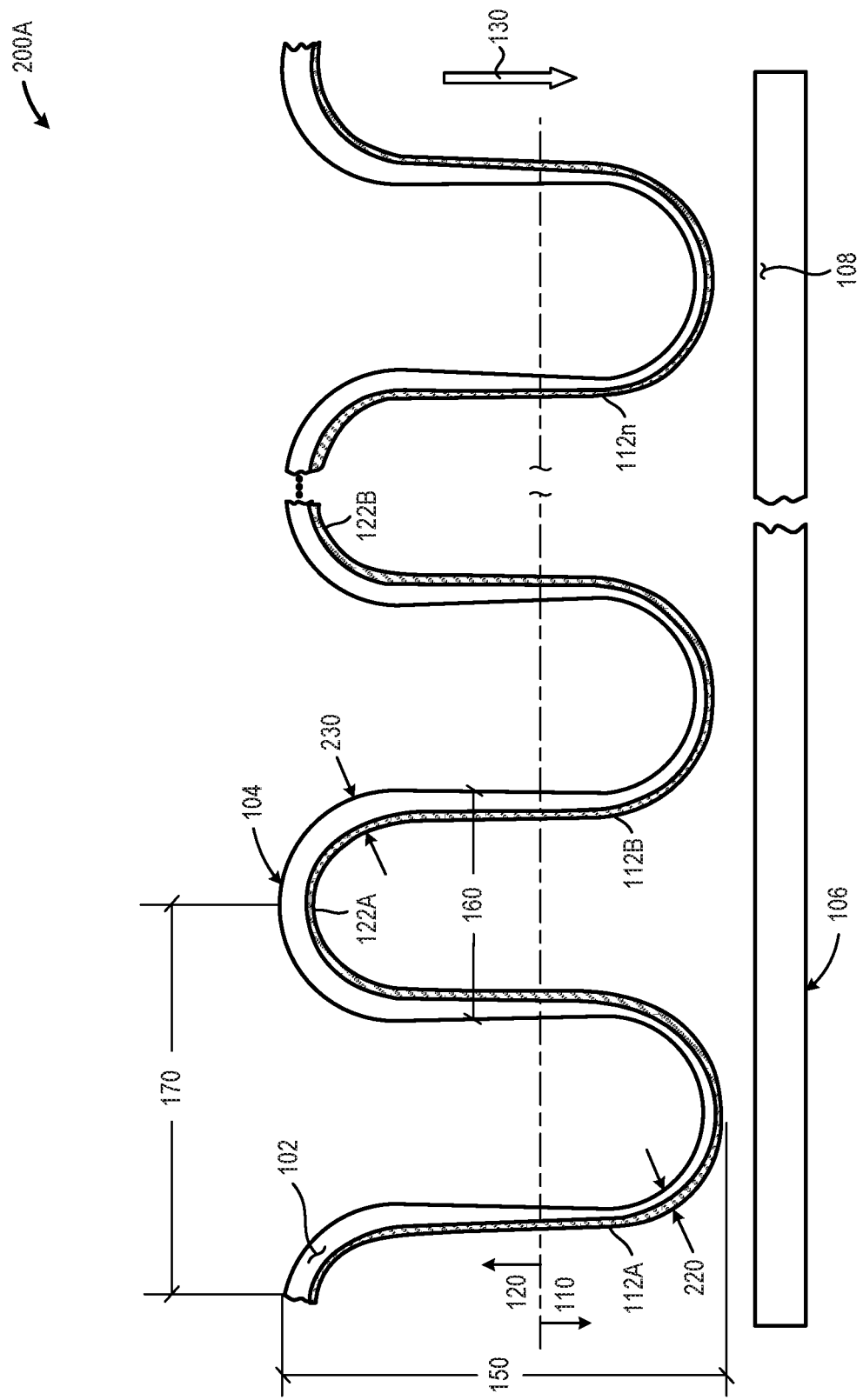
FIG. 2A is a cross-sectional elevation of an example heatsink that includes a thermally conductive material formed into a corrugated ribbon that includes a first, deformable, portion having a first thickness and a second, convective, portion having a second thickness which is greater than the first thickness, in accordance with at least one embodiment described herein.
Figure 2B:
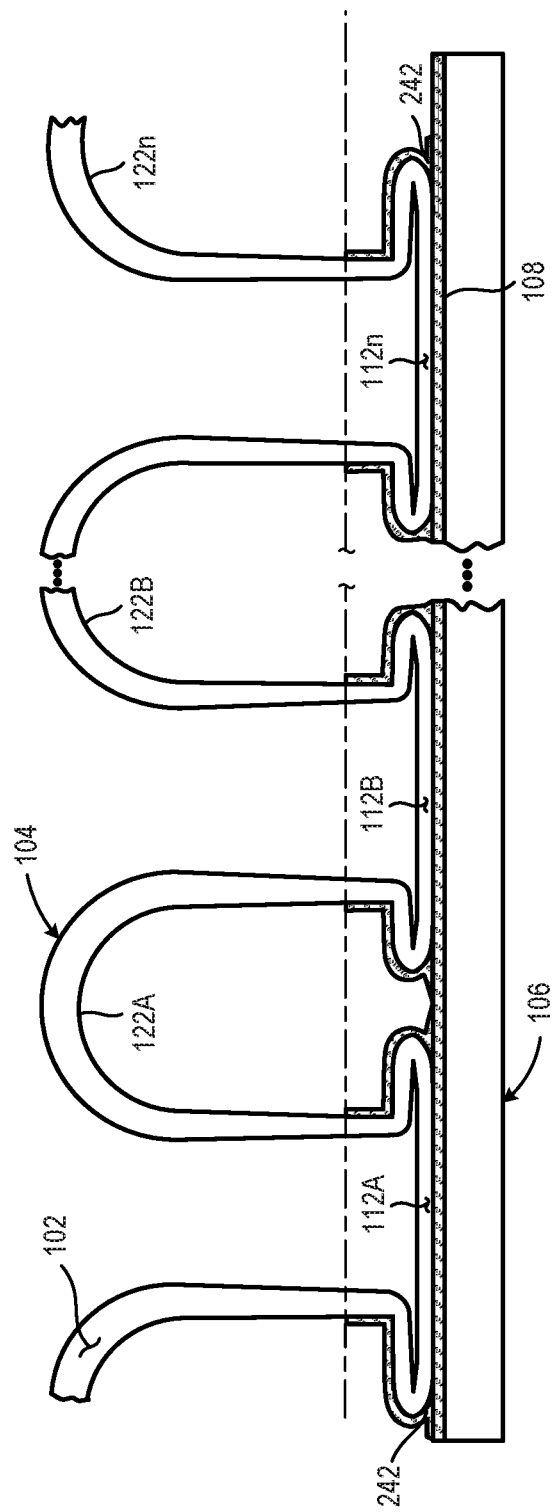
FIG. 2B is a cross-sectional elevation of the example heatsink of FIG. 2A after application of sufficient pressure to distort the first, deformable, portion such that the first, deformable, portion conforms to at least a portion of an external surface of an electronic device, in accordance with at least one embodiment described herein.

FIG. 2A is a cross-sectional elevation of an example heatsink 200 that includes a thermally conductive material 102 formed into a corrugated ribbon 104 that includes a first, deformable, portion 110 having a first thickness 220 and a second, convective, portion 120 having a second thickness 230 which is greater than the first thickness 220, in accordance with at least one embodiment described herein. FIG. 2B is a cross-sectional elevation of the example heatsink 200 of FIG. 2A after application of sufficient pressure to distort the first, deformable, portion 110 such that the first, deformable, portion 110 is disposed proximate at least a portion of an external surface 108 of an electronic device 106, in accordance with at least one embodiment described herein.

In embodiments, such as depicted in FIG. 2A, all or a portion of an external surface of the corrugated ribbon 104 may include a coating or layer 240 that includes one or more low-melt temperature, thermally conductive, materials 240. In such embodiments, at least a portion of the coating or layer 240 may be reflowed, as depicted in FIG. 2B, to physically affix or bond and to thermally couple the heatsink 200 to the external surface 108 of the electronic device 106. Those of skill in the relevant arts will readily appreciate the use of such a reflow to physically affix and thermally couple the heatsink 200 to the electronic device may be applied with equal efficiency to the deformable heatsink 100A depicted in FIGS. 1A and 1B. Likewise, those of skill in the relevant arts will readily appreciate the use of thermally conductive mechanical fasteners and/or chemical adhesives to physically affix and thermally couple the deformable heatsink 100A to the electronic device 106 as depicted in FIGS. 1A and 1B may be applied with equal efficiency to the deformable heatsink 200A.

In embodiments, the first, deformable, portion 110 of the corrugated ribbon 104 may have a first thickness 220 and the second, convective, portion 120 may have a second thickness 230 that is greater than the first thickness. In such an embodiment, the corrugated ribbon 104 may smoothly transition from the first thickness 220 to the second thickness 240. In such an embodiment, the corrugated ribbon 104 may stepwise transition from the first thickness 220 to the second thickness 230. The reduced thickness of the first, deformable, portion 110 facilitates the distortion or deformation of the portion upon application of an external force 130 to the heatsink 200. In embodiments, the second, convective, portion 120 of the corrugated ribbon 104 may have a second thickness 230 of less than: about 5 millimeters (mm); about 3 mm; about 2 mm; about 1 mm; about 0.5 mm (500 micrometers, μm); about 0.1 mm (100 μm); about 0.05 mm (50 μm); or about 0.01 mm (10 μm). In embodiments, the first, deformable, portion 110 of the corrugated ribbon 104 may have a first thickness 220 of: about 80% or less of the second thickness; about 65% or less of the second thickness; about 50% or less of the second thickness; about 40% or less of the second thickness; about 30% or less of the second thickness; about 20% or less of the second thickness; or about 10% or less of the second thickness.

Referring now to FIG. 2B, after physically distorting the heatsink 200 against the external surface 108 of the electronic device 106 the assembly may be heated to a temperature greater than the melting temperature of the one or more low-melt temperature, thermally conductive, materials 240. At elevated temperatures, the low-melt temperature material 240 reflows across the surface of the heatsink 200 and onto the external surface 108 of the electronic device 106. The cooled reflow material 242 accumulates and/or pools between the deformable heatsink 200 and the external surface 108 of the electronic device 106 physically affixing and thermally coupling the heatsink 200 to the electronic device 106.

Figure 3:
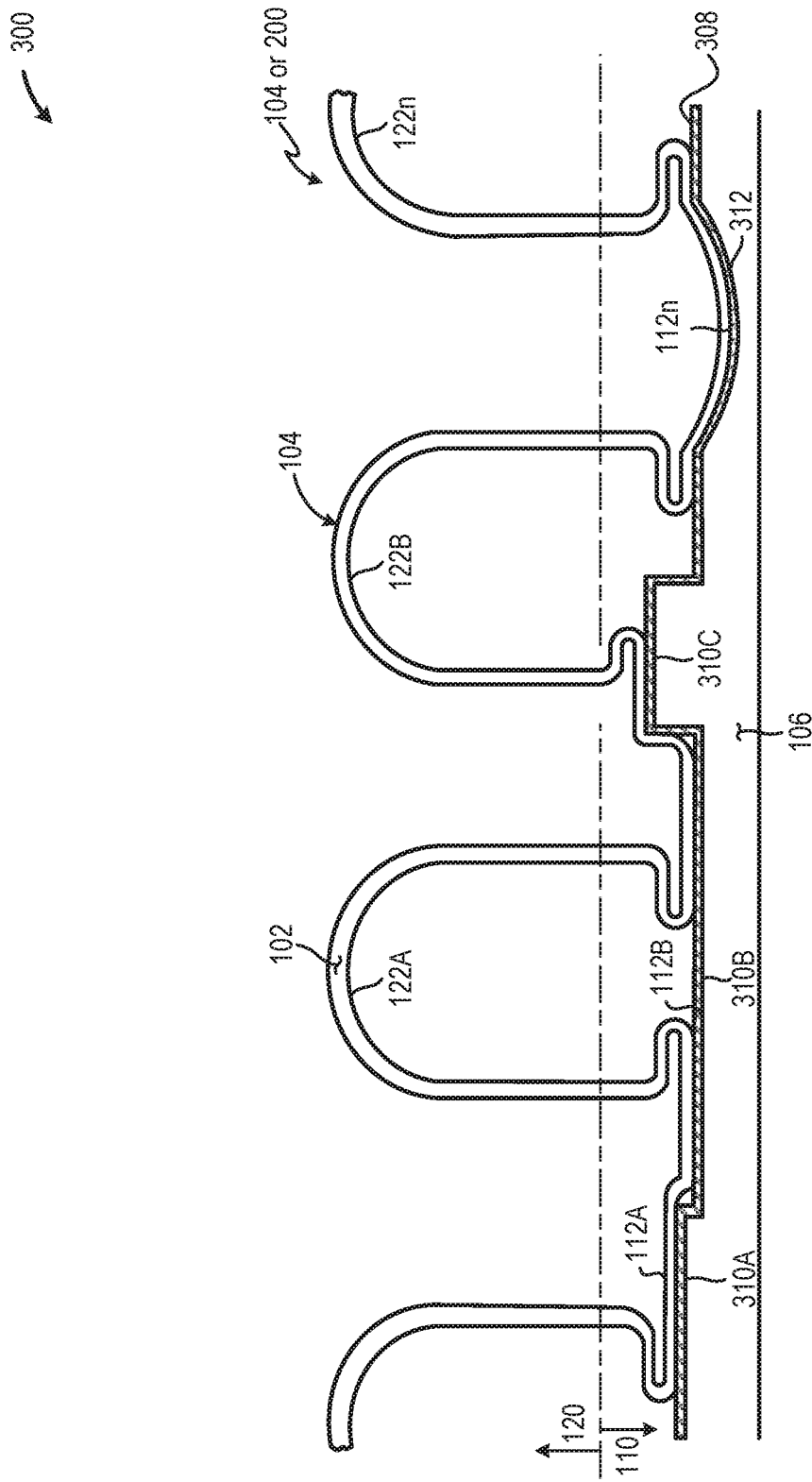
FIG. 3 is a cross-sectional elevation of an illustrative system that includes an example heatsink such as depicted in FIGS. 1A and 1B or an example heatsink such as depicted in FIGS. 2A and 2B in which the first, deformable, portion of the heatsink corresponds to an irregular external surface of an electronic device, in accordance with at least one embodiment described herein.

FIG. 3 is a cross-sectional elevation of an illustrative system 300 that includes an example heatsink 100 such as depicted in FIGS. 1A and 1B or an example heatsink 200 such as depicted in FIGS. 2A and 2B disposed proximate an electronic device 106 having an irregular external surface 308, in accordance with at least one embodiment described herein. In embodiments, the heatsink 100, 200 may be disposed proximate an electronic device 106 having an irregular external surface 308. Such an irregular external surface 308 may include any number of portions 310A-310C having differing elevations and/or any number of portions 312 that may be curved, dished (e.g., concave), hemispherical (e.g., convex), elliptically dished, elliptically hemispherical, or combinations thereof.

The ability for the heatsink 100, 200 to follow an irregular surface contour on the external surface 308 of the electronic device 106 represents a significant advantage over conventional, rigid base, heatsinks. The heat transferred between two bodies is proportional, among other things, to the heat transfer area and the difference in temperature between the objects. The first, deformable, portion 110 of the heatsink 100, 200 deforms or distorts to follow the contours of the external surface 308, increasing the surface area available for heat transfer between the electronic device 106 and the second, convective, portion 120 of the heatsink 100, 200. In contrast, a rigid base heatsink would only contact the irregular surface at "high spots" reducing the surface area available for heat transfer. Thus, the heatsinks 100, 200 provide enhanced heat transfer capabilities and a lighter weight installation than comparable, conventional, rigid-base type heatsinks or spreaders.

Figure 4:
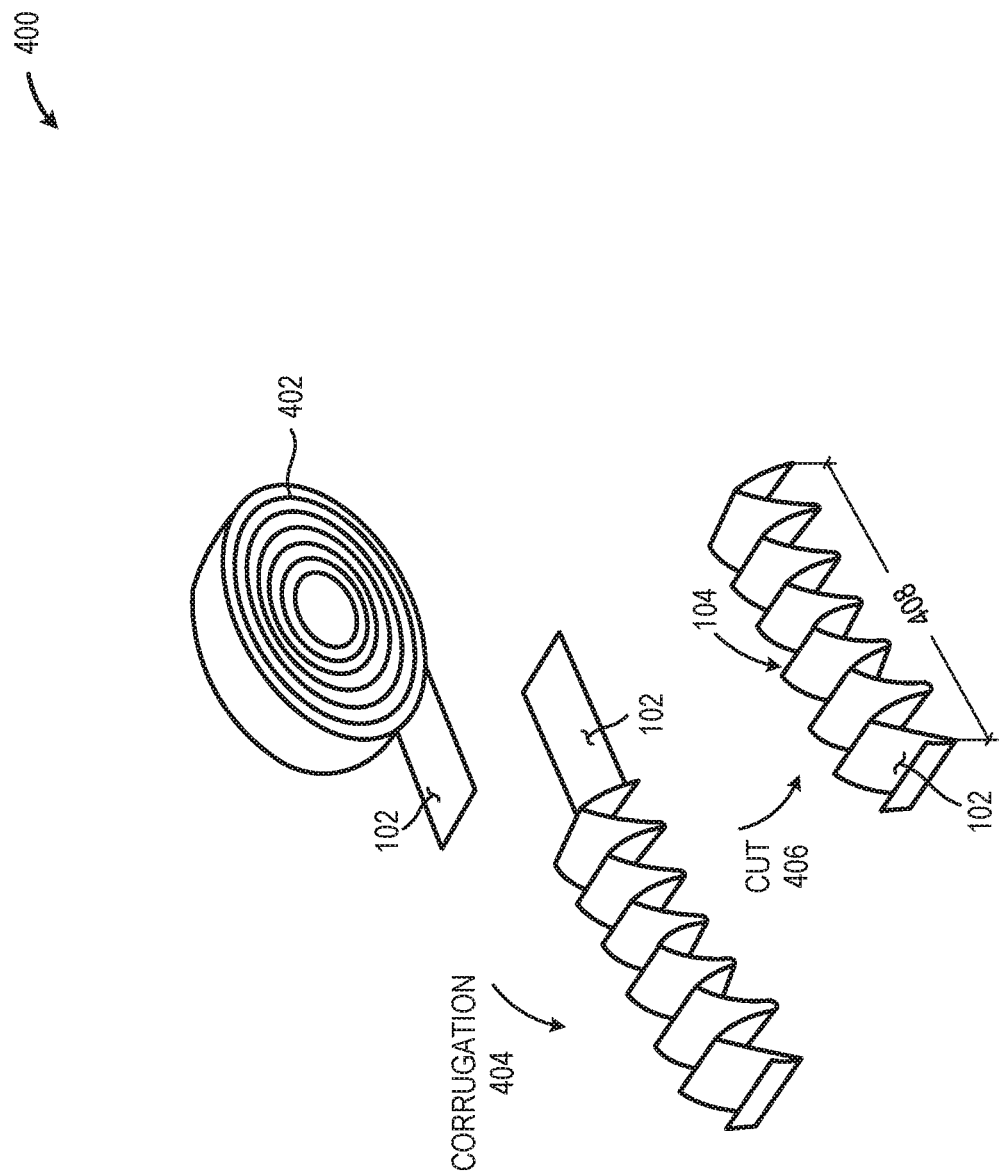
FIG. 4 is a perspective view of an illustrative system for fabricating an example heatsink such as depicted in FIGS. 1A and 1B or an example heatsink such as depicted in FIGS. 2A and 2B, in accordance with at least one embodiment described herein.

FIG. 4 is a perspective view of an illustrative system 400 for fabricating an example heatsink 100 such as depicted in FIGS. 1A and 1B or an example heatsink 200 such as depicted in FIGS. 2A and 2B, in accordance with at least one embodiment described herein. As depicted in FIG. 4, a coil 402 of thermally conductive material 102 having the second thickness 230 may be corrugated 404 using any current or future developed technique for corrugating metal strips. In some implementations, when corrugating 404 the thermally conductive material 102, one or more rollers or similar devices may be used to form the surface features 114 in each of at least some of the corrugations. In other implementations, when corrugating 404 the thermally conductive material 102, one or more rollers or similar devices may be used to compress the thermally conductive material 102 in the first, deformable, portion 110 in each of at least some of the corrugations reduce the thickness of the thermally conductive material in the first, deformable, portion 110 from the second thickness 230 to the first thickness 220. In embodiments, the transition from the first thickness 220 to the second thickness 230 may include a continuous transition from the first thickness 220 to the second thickness 230. In other embodiments, the transition from the first thickness 220 to the second thickness 230 may include one or more step transitions from the first thickness 220 to the second thickness 230. The corrugated thermally conductive material 102 may be trimmed 406 to any desired length 408 to provide the corrugated ribbon 104. In embodiments, the length 408 may be selected based, at least in part, on one or more physical dimensions (length, width, height of irregularities, etc.) of the external surface 108 of the electronic device 106.

Figure 5:
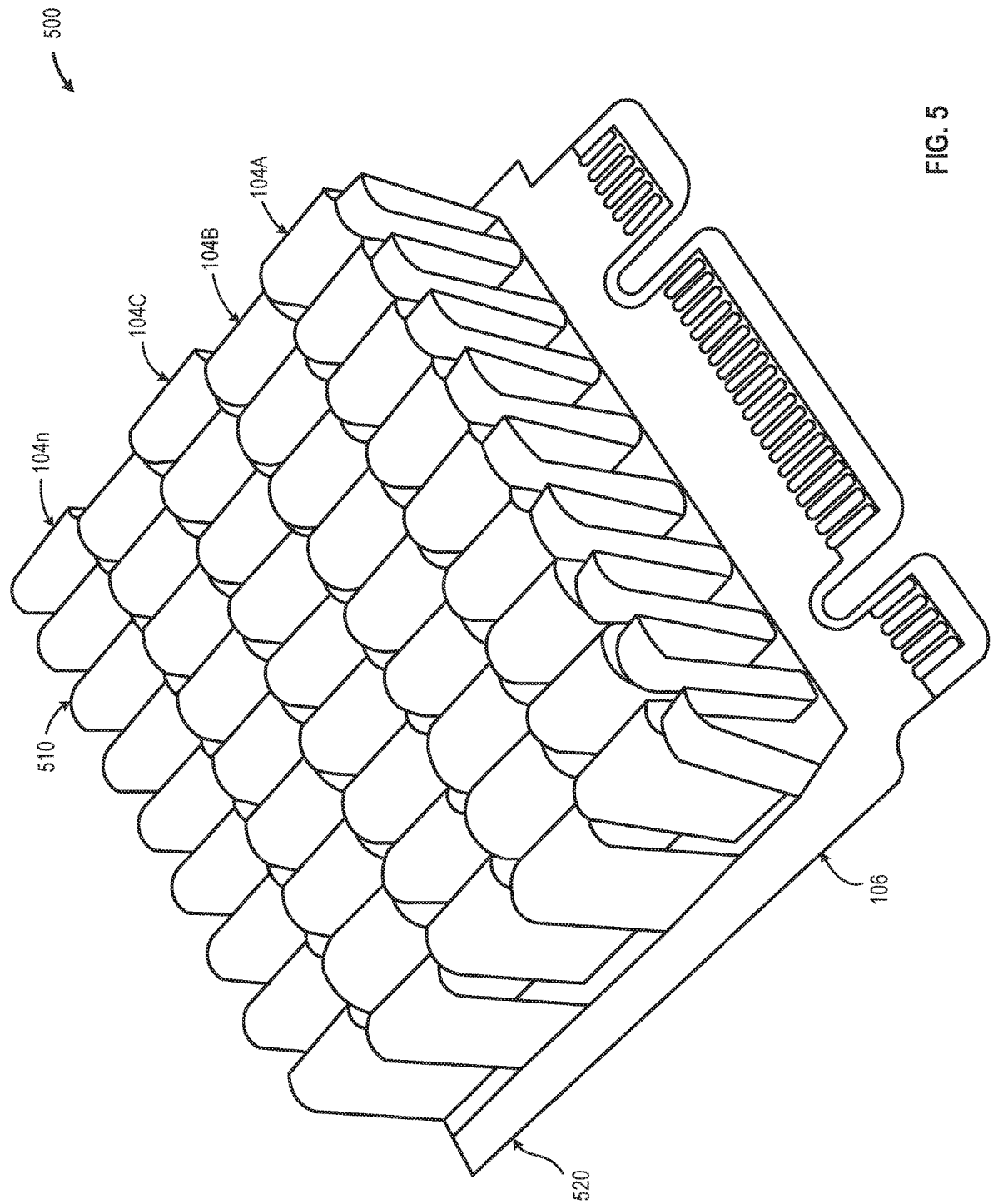
FIG. 5 is a perspective view of an illustrative system that includes a heatsink formed by a plurality of conjoined corrugated ribbons physically affixed and thermally coupled to an electronic device, in accordance with at least one embodiment described herein.

FIG. 5 is a perspective view of an illustrative system 500 that includes a heatsink 510 formed by a plurality of conjoined corrugated ribbons 104A-104n physically affixed and thermally coupled to an electronic device 520, in accordance with at least one embodiment described herein. In embodiments, the heatsink 510 may include any number of corrugated ribbons 104. In embodiments, the corrugated ribbons 104 may be physically affixed to each other, physically affixed to an external surface of the electronic device 520, or physically affixed to both each other and the external surface of the electronic device 520. In embodiments, such as that depicted in FIG. 5, each of the corrugated ribbons 104B may be offset from the immediately adjacent corrugated ribbons 104A and 104C. Such an offset beneficially disrupts the thermal boundary layer that develops along the surface of the corrugated strip 104 and promotes turbulent flow through the heatsink 520, improving the overall heat transfer efficiency of the heatsink 520.

In embodiments, the corrugated ribbons 104 may include a low-melt temperature material coating or layer 240. In such embodiments, all or a portion of the low-melt temperature material coating or layer 240 may be reflowed to physically affix or bond together the plurality of conjoined corrugated ribbons 104. In some implementations, the low-melt temperature material coating or layer 240 may also physically affix and thermally couple the heatsink 510 to the electronic device 510.

Figure 6:
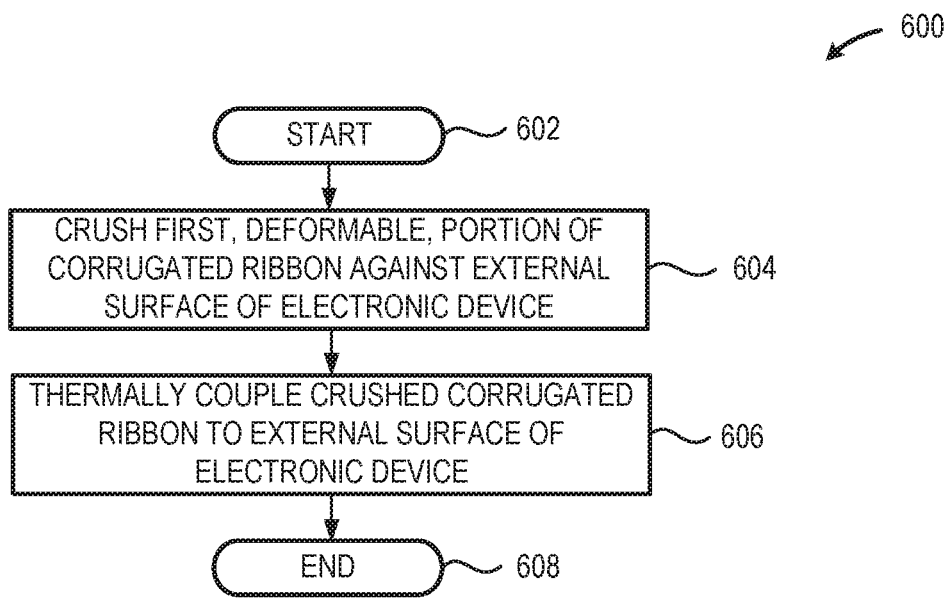
FIG. 6 is a high-level logic flow diagram of an illustrative method of fabricating a cooling system for an electronic device using an example heatsink such as depicted in FIGS. 1A and 1B or an example heatsink such as depicted in FIGS. 2A and 2B that is thermally conductively coupled and physically affixed to an external surface of the electronic device, in accordance with at least one embodiment described herein.

FIG. 6 is a high-level logic flow diagram of an illustrative method 600 of fabricating a cooling system for an electronic device 106 using an example heatsink 100 such as depicted in FIGS. 1A and 1B or an example heatsink 200 such as depicted in FIGS. 2A and 2B that is thermally conductively coupled and physically affixed to an external surface 108 of the electronic device 106, in accordance with at least one embodiment described herein. In embodiments, the heatsink 100, 200 may include one or more conductive ribbons 104A-104n, each having a first, deformable, portion 110, and a second, convective, portion 120. The first, deformable, portion 110 is crushed against and thermally coupled to the external surface 108 of the electronic device 106. The crushed section of the first, deformable, portion 110 conforms to the external surface 108. The crushed section of the first, deformable, portion 110 provides an increased heat transfer surface area between the electronic device 106 and the second, convective, portion 120. The method 600 commences at 602.

At 604, the first, deformable, portion 110 of the corrugated ribbon 104 is crushed against at least a portion of an external surface 108 of an electronic device 106. After crushing against the external surface 108, the first, deformable, portion 110 of the corrugated ribbon 104 may conform to all or a portion of the external surface 108 of the electronic device 106. The conformance of the first, deformable, portion 110 of the corrugated ribbon 104 to the external surface 108 of the electronic device 106 beneficially increases the available heat transfer surface area between the second, convective, portion 120 of the heatsink 100, 200 and the electronic device. Surprisingly, while crushing a finset (i.e., a corrugated ribbon thermally coupled to a fluid-filled tube) typically reduces heat transfer efficiency and effectiveness of a conventional radiator, in this instance, crushing the first, deformable, portion 110 of the corrugated ribbon 104 improves the overall heat transfer efficiency of the heatsink 100, 200.

At 606, the heatsink 100, 200 is thermally coupled and physically affixed to the electronic device 106. In some implementations, the heatsink 100, 200 may be thermally coupled and physically affixed to an external surface 108 of the electronic device 106. In some implementations, the heatsink 100, 200 may be thermally coupled and physically affixed to an external surface 108 of a housing disposed at least partially about an electronic device 106.

In some implementations, one or more mechanical fasteners (screws, clamps, camlocks, etc.) may physically affix and thermally couple the heatsink 100, 200 to the electronic device 106, the external surface 108 of the electronic device, or a housing disposed at least partially about the electronic device 106. In other implementations, one or more thermally conductive materials and/or adhesives 140 may physically affix and thermally couple the heatsink 100, 200 to the electronic device 106, the external surface 108 of the electronic device, or a housing disposed at least partially about the electronic device 106.

In some implementations, the heatsink 100, 200 may include a layer of low-melt point (e.g., M.P. of less than 230° C.) thermally conductive material 240 disposed at least partially across the external surfaces of the heatsink 100, 200. In such implementations, the heatsink 100, 200 may be physically affixed and thermally coupled to an external surface 108 of the electronic device 106 by passing the heatsink 100, 200 and electronic device 106 through a reflow oven where the low-melt point thermally conductive material 240 reflows onto the external surface 108 of the electronic device 106. The cooled low-melt point thermally conductive material 242 physically affixes and thermally couples the heatsink 100, 200 to the electronic device 106. The method 600 concludes at 608.

Figure 7:
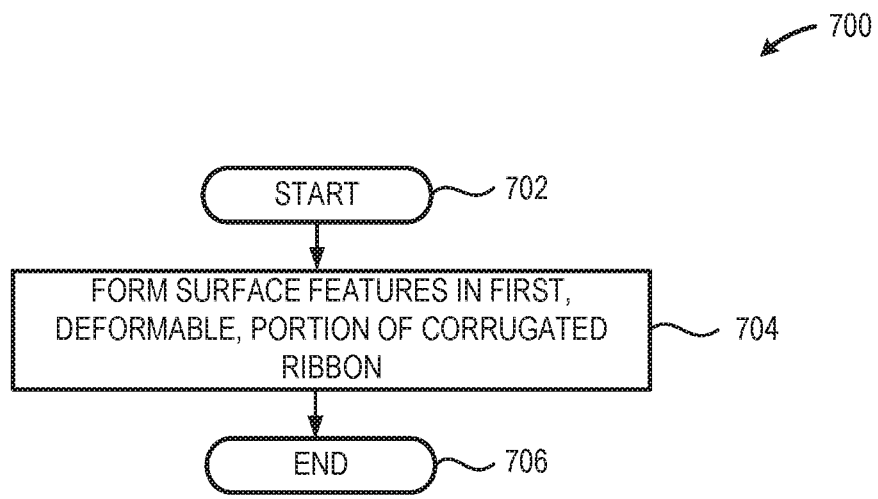
FIG. 7 is a high-level logic flow diagram of an illustrative method of fabricating a first, deformable, portion of an example heatsink such as depicted in FIGS. 1A and 1B or an example heatsink such as depicted in FIGS. 2A and 2B prior to thermally conductively coupling the heatsink to an external surface of the electronic device, in accordance with at least one embodiment described herein.

FIG. 7 is a high-level logic flow diagram of an illustrative method 700 of fabricating a first, deformable, portion 110 of an example heatsink 100 such as depicted in FIGS. 1A and 1B or an example heatsink 200 such as depicted in FIGS. 2A and 2B prior to thermally conductively coupling the heatsink 100, 200 to an external surface 108 of the electronic device 106, in accordance with at least one embodiment described herein. In embodiments, the first, deformable, portion 110 of the heatsink 100, 200 may include one or more surface features to facilitate a desirable or a defined deformation or distortion upon crushing against an electronic device 106. The method 700 may be used in conjunction with the method 600 described in detail above regarding FIG. 6. The method 700 commences at 702.

At 704, one or more surface features are disposed in, on, or about all or a portion of the first, deformable, portion 110 at least some of the corrugated ribbons 104 forming the heatsink 100, 200. In some implementations, the one or more surface features may include one or more surface features 114, such as one or more: bends, grooves, curves, breaks, or similar features, formed in the first, deformable, portion 110. The surface features 114 may cause the first, deformable, portion 110 of the corrugated ribbons 104 to deform in a defined or predictable manner such that the deformed corrugated ribbons 104 conform to the external surface 108 of the electronic device. In some implementations, the surface features may include a first, deformable, portion 110 having a first thickness 220 and a second, convective, portion 120 having a second thickness 230. In such implementations, the first thickness is less than the second thickness. The one or more surface facilitate a desirable or a defined deformation or distortion of the first, deformable, portion 110 of the corrugated ribbon 104 upon crushing the heatsink 100, 200 against an external surface 108 of an electronic device 106. The method 700 concludes at 706.

While FIGS. 6 and 7 illustrate various operations per one or more embodiments, it is to be understood that not all the operations depicted in FIGS. 6 and 7 are necessary for other embodiments. Indeed, it is fully contemplated herein that in other embodiments of the present disclosure, the operations depicted in FIGS. 6 and 7, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

As used in any embodiment herein, the terms "system" or "module" may refer to, for example, software, firmware and/or circuitry configured to perform any of the aforementioned operations. Software may be embodied as a software package, code, instructions, instruction sets and/or data recorded on non-transitory computer readable storage mediums. Firmware may be embodied as code, instructions or instruction sets and/or data that are hard-coded (e.g., non-volatile) in memory devices. "Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry or future computing paradigms including, for example, massive parallelism, analog or quantum computing, hardware embodiments of accelerators such as neural net processors and non-silicon implementations of the above. The circuitry may, collectively or individually, be embodied as circuitry that forms part of a larger system, for example, an integrated circuit (IC), system on-chip (SoC), desktop computers, laptop computers, tablet computers, servers, smartphones, etc.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software executed by a programmable control device.

Thus, the present disclosure is directed to systems and methods for providing a heatsink for use with electronic devices. The heatsink includes a fin-set that includes a corrugated ribbon having a first, deformable, portion and a second, convective, portion that is not deformed. A plurality of corrugated ribbons may be physically and/or thermally coupled (e.g., via mechanical fasteners, thermally conductive bonding, or reflow) to form the heatsink. A force may be applied to the heatsink sufficient to at least partially crush the first, deformable, portion. In some implementations, the first, deformable, portion may be crushed against the electronic device. In some implementations, the first, deformable, portion may be pre-crushed against a surface prior to affixing the heatsink to the electronic device. The heatsink may be physically affixed and thermally coupled to an external surface of the electronic device via mechanical fasteners, thermally conductive adhesives or via reflow of a low-melt temperature layer disposed on an external surface of the heatsink. The crushed portion of the first, deformable, portion conforms to the regular (e.g., planar) or irregular surface profile of the electronic device, beneficially and surprisingly improving thermal performance of the heatsink.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for providing a heatsink having a first, deformable, portion for use with electronic devices.

According to example 1, there is provided a heatsink to dissipate heat generated by an electronic device. The heatsink may include: a corrugated ribbon of thermally conductive material; where the corrugated ribbon includes a plurality first bends at a first angle opposed to a plurality of second bends at a second angle, each of the plurality of first bends thermally coupleable an external surface of an electronic device and each of the plurality of second bends disposed remote from the external surface of the electronic component; and where each of the first bends includes at least one surface feature to facilitate deformation of the respective first bend upon contact with the external surface of the electronic device to provide a thermal contact area proximate the external surface of the electronic device.

Example 2 may include elements of example 1 where the thermally conductive material forming each of the plurality of first bends comprises a material having a first thickness; where the thermally conductive material forming each of the plurality of second bends comprises a material having a second thickness; and where the first thickness is less than the second thickness.

Example 3 may include elements of example 1 where the at least one surface feature is formed integral with the first bend.

Example 4 may include elements of example 3 where the at least one surface feature comprises a plurality of surface features.

Example 5 may include elements of example 4 where the plurality of surface features is formed symmetrically about the first bend.

Example 6 may include elements of example 1, and the heatsink may additionally include a plurality of corrugated ribbons, each of the plurality of corrugated ribbons disposed laterally adjacent to and thermally coupled to at least one other of the plurality of corrugated ribbons.

Example 7 may include elements of example 1 where each of the plurality of first bends comprises a constant radius 180° bend; and where each of the plurality of second bends comprises a constant radius 180° bend.

Example 8 may include elements of example 1 where each of the plurality of first bends comprises a varying radius bend of less than 180°; and where each of the plurality of second bends comprises a varying radius bend of less than 180°.

According to example 9, there is provided an electronic device. The electronic device may include a housing disposed about the electronic device, the housing including at least one external surface; a heatsink that includes: a corrugated ribbon of thermally conductive material; where the corrugated ribbon includes a plurality first bends at a first angle opposed to a plurality of second bends at a second angle, each of the plurality of first bends thermally coupleable an external surface of the housing disposed about the electronic device and each of the plurality of second bends disposed remote from the external surface of the housing disposed about the electronic device; and where each of the first bends includes at least one surface feature to facilitate deformation of the respective first bend upon contact with the external surface of the housing disposed about the electronic device to provide a thermal contact area proximate the external surface of the housing disposed about the electronic device.

Example 10 may include elements of example 9 where the heatsink may further include a thermally conductive adhesive thermally coupling at least a portion of the at least one extended surface of the housing to the heatsink.

Example 11 may include elements of example 9 where the at least one surface feature may include at least one surface feature formed integral with the second bend.

Example 12 may include elements of example 9 where the thermally conductive material forming each of the plurality of first bends may include a material having a first thickness; where the thermally conductive material forming each of the plurality of second bends may include a material having a second thickness; and wherein the first thickness is less than the second thickness.

Example 13 may include elements of example 9 where the at least one surface feature may include a plurality of surface features.

Example 14 may include elements of example 13 where the surface features included in the plurality of surface features are formed symmetrically about the second bend.

Example 15 may include elements of example 9 where the heatsink may further include a plurality of corrugated ribbons, each of the plurality of corrugated ribbons disposed laterally adjacent to at least one other of the plurality of corrugated ribbons.

Example 16 may include elements of example 9 where each of the plurality of first bends may include a constant radius 180° bend; and where each of the plurality of second bends may include a constant radius 180° bend.

Example 17 may include elements of example 9 where each of the plurality of first bends may include a varying radius bend of less than 180°; and where each of the plurality of second bends may include a varying radius bend of less than 180°.

Example 18 may include elements of any of examples 9 through 17 where the housing may include a semiconductor package and the electronic device comprises a semiconductor die.

Example 19 may include elements of any of examples 9 through 17 where the housing may include a solid-state drive housing and the electronic device comprises a solid-state drive.

According to example 20, there is provided a method of conducting heat away from an electronic device using a heatsink. The method may include deforming a corrugated ribbon of thermally conductive material against an external surface of an electronic device; where the corrugated ribbon includes a plurality first bends at a first angle opposed to a plurality of second bends at a second angle, each of the plurality of first bends thermally coupleable an external surface of an electronic device and each of the plurality of second bends disposed remote from the external surface of the electronic device; and where each of the first bends includes at least one surface feature to facilitate deformation of the respective first bend upon contact with the external surface of the electronic device to provide a thermal contact area proximate the external surface of the electronic device and; thermally coupling the deformed corrugated ribbon to the external surface of the electronic device.

Example 21 may include elements of example 20 where deforming a corrugated ribbon of thermally conductive material against an external surface the electronic device may include deforming a corrugated ribbon of thermally conductive material against an external surface of the electronic device; where the thermally conductive material forming each of the plurality of first bends comprises a material having a first thickness; where the thermally conductive material forming each of the plurality of second bends comprises a material having a second thickness; and where the first thickness is less than the second thickness.

Example 22 may include elements of example 20, and the method may additionally include applying a thermally conductive adhesive across at least a portion of the external surface of the electronic device prior to deforming the corrugated ribbon of thermally conductive material against the external surface of the electronic device.

Example 23 may include elements of example 22 where deforming a corrugated ribbon of thermally conductive material against an external surface the electronic device may include deforming a corrugated ribbon of thermally conductive material having at least one surface formed integral with the second bend against an external surface of the electronic device.

Example 24 may include elements of example 20 where deforming a corrugated ribbon of thermally conductive material against an external surface of the electronic device may include deforming a corrugated ribbon of thermally conductive material having a plurality of surface features formed integral with the second bend against the external surface of the electronic device.

Example 25 may include elements of example 20 where deforming a corrugated ribbon of thermally conductive material against an external surface the electronic device may include deforming a corrugated ribbon of thermally conductive material having a plurality of surface features formed symmetrically about the second bend against the external surface of the housing of the electronic device.

Example 26 may include elements of example 20 where deforming a corrugated ribbon of thermally conductive material against an external surface the electronic device may include deforming a plurality of corrugated ribbons of thermally conductive material against an external surface the electronic device, wherein each of the plurality of corrugated ribbons of thermally conductive material is disposed laterally adjacent to at least one other of the plurality of corrugated ribbons of thermally conductive material.

Example 27 may include elements of example 20 where deforming a corrugated ribbon of thermally conductive material against an external surface the electronic device may include deforming, against an external surface of the electronic device, a corrugated ribbon of thermally conductive material in which each of the plurality of first bends may include a constant radius 180° bend and in which each of the plurality of second bends comprises a constant radius 180° bend.

Example 28 may include elements of example 20 where deforming a corrugated ribbon of thermally conductive material against an external surface of the electronic device may include deforming, against an external surface of the electronic device, a corrugated ribbon of thermally conductive material in which each of the plurality of first bends may include a varying radius bend of less than 180° and in which each of the plurality of second bends comprises a varying radius bend of less than 180°.

Example 29 may include elements of any of examples 20 through 28 where deforming a corrugated ribbon of thermally conductive material against an external surface of the electronic device may include deforming a corrugated ribbon of thermally conductive material against an external surface of a semiconductor package.

Example 30 may include elements of any of example 20 through 28 where deforming a corrugated ribbon of thermally conductive material against an external surface of the electronic device may include deforming a corrugated ribbon of thermally conductive material against an external surface of a solid-state drive.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A heatsink to dissipate heat generated by an electronic device, the heatsink comprising:
a ribbon including:
a core including a first thermally conductive material having a first melt temperature, and
an outer layer carrying the core, the outer layer including a second thermally conductive material compositionally different from the first thermally conductive material, the second thermally conductive material having a second melt temperature less than the first melt temperature, the second thermally conductive material including a tin-based material;
wherein the ribbon includes a plurality first bends at a first angle opposed to a plurality of second bends at a second angle, respective first bends of the plurality of first bends thermally coupleable to an external surface of an electronic device and respective second bends of the plurality of second bends disposed remote from the external surface of the electronic device when respective first bends of the plurality of first bends are coupled to the external surface of the electronic device; and
wherein at least one of the first bends includes a surface feature to facilitate deformation of the respective first bend upon forcible contact with the external surface of the electronic device to provide a thermal contact area proximate the external surface of the electronic device, the surface feature to cause a portion of the ribbon at the first bend to become parallel to the external surface of the electronic device.

2. The heatsink of claim 1,
wherein the ribbon has a first thickness at respective ones of the first bends;
wherein the ribbon has a second thickness at respective ones of the second bends; and
wherein the first thickness is less than the second thickness.

3. The heatsink of claim 1, wherein the surface feature is integral with the first bend.

4. The heatsink of claim 3, wherein the surface feature is a first surface feature, and the first bend includes a second surface feature and a third surface feature.

5. The heatsink of claim 4, wherein the first surface feature, the second surface feature, and the third surface feature are symmetrical about the first bend.

6. The heatsink of claim 1, wherein the ribbon is a first ribbon, the heat sink further includes a second ribbon adjacent to and thermally coupled to the first ribbon.

7. The heatsink of claim 1,
wherein respective first bends of the plurality of first bends include a first constant radius 180° bend; and
wherein respective second bends of the plurality of second bends include a second constant radius 180° bend.

8. The heatsink of claim 1,
wherein respective first bends of the plurality of first bends include a first varying radius bend of less than 180° ; and
wherein respective second bends of the plurality of second bends include a second varying radius bend of less than 180°.

9. The heatsink of claim 4, wherein the first surface feature includes a first convex wall on a first side of the first bend, the second surface feature includes a concave wall between the first surface feature and the third surface feature at an apex or a nadir of the first bend, and the third surface feature includes a second convex wall on a second side of the first bend opposite the first side.

10. A method of conducting heat away from an electronic device, comprising:
deforming a ribbon against a surface of the electronic device;
the ribbon including:
a core including a first thermally conductive material having a first melt temperature, and
an outer layer carrying the core, the outer layer including a second thermally conductive material compositionally different from the first thermally conductive material, the second thermally conductive material having a second melt temperature less than the first melt temperature, the second thermally conductive material including a tin-based material,
the ribbon including a plurality of first bends at a first angle opposed to a plurality of second bends at a second angle, respective first bends of the plurality of first bends thermally coupleable to the surface of the electronic device and respective second bends of the plurality of second bends remote from the surface of the electronic device when respective first bends of the plurality of first bends are coupled to the surface of the electronic device, and
at least one of the first bends including a surface feature, the deforming of the ribbon including bending the ribbon at the surface feature upon contact with the surface of the electronic device to cause a portion of the ribbon at the first bend to be parallel to the surface of the electronic device; and
reflowing at least a portion of the first material to thermally couple the deformed ribbon to the surface of the electronic device.

11. The method of claim 10,
wherein the ribbon has a first thickness at respective ones of the first bends;
wherein the ribbon has a second thickness at respective ones of the second bends; and
wherein the first thickness is less than the second thickness.

12. The method of claim 10, further including applying a thermally conductive adhesive across at least a portion of the surface of the electronic device prior to the deforming of the ribbon against the surface of the electronic device.

13. The method of claim 10, wherein the surface feature is integral with the first bend, and wherein the deforming of the ribbon against the surface of the electronic device includes deforming the surface feature against the surface of the electronic device.

14. The method of claim 10, wherein the surface feature is a first surface feature, the first bend includes a second surface feature and a third surface feature, the first surface feature, the second surface feature, and the third surface feature are symmetrical around the first bend, and the
deforming of the ribbon against the external surface of the electronic device includes deforming the first surface feature, the second surface feature and the third surface feature about the first bend against the surface of the housing of the electronic device.

15. The method of claim 10, wherein the ribbon is a first ribbon, the method further including deforming a second ribbon of thermally conductive material against the surface the electronic device, the second ribbon lateral to the first ribbon.

16. The method of claim 10, wherein at least one of the first bends of the plurality of first bends includes a first constant radius 180° bend, and wherein at least one of the second bends of the plurality of second bends includes a second constant radius 180° bend.

17. The method of claim 10, wherein at least one of the first bends of the plurality of first bends includes a first varying radius bend of less than 180°, and wherein at least one of the second bends of the plurality of second bends includes a second varying radius bend of less than 180°.

18. The method of claim 10, wherein the surface is at least one of an external surface of a semiconductor package or an external surface of a solid state drive.

19. The method of claim 10, wherein the surface is a contoured, non-planar, surface.

20. The method of claim 19, wherein the deforming of the ribbon causes the surface feature to crush.

21. An electronic device, comprising:
a housing disposed about the electronic device, the housing including a surface; and
a heatsink including:
a ribbon including:
a core including a first thermally conductive material having a first melt temperature, and
an outer layer supporting the core, the outer layer including a second thermally conductive-material compositionally different from the first thermally conductive material, the second thermally conductive material having a second melt temperature less than the first melt temperature,
wherein the ribbon includes a plurality first bends at a first angle opposed to a plurality of second bends at a second angle, respective first bends of the plurality of first bends thermally coupleable to the surface of the housing and respective second bends of the plurality of second bends disposed remote from the surface of the housing, and
wherein at least one of the first bends includes a first surface feature and a second surface feature opposite the first surface feature, the first bend deformed about the first surface feature and the second surface feature to provide a thermal contact area proximate the surface of the housing, the first surface feature and the second surface feature to cause a portion of the ribbon at the first bend to become parallel to the surface of the housing.

22. The electronic device of claim 21, wherein the heatsink further includes: a thermally conductive adhesive to thermally couple at least a portion of the surface of the housing to the heatsink.

23. The electronic device of claim 21, wherein the surface feature is integral with the first bend.

24. The electronic device of claim 21,
wherein the ribbon has a first thickness at respective ones of the first bends;
wherein the ribbon has a second thickness at respective ones of the second bends; and
wherein the first thickness is less than the second thickness.

25. The electronic device of claim 21, wherein the surface feature is a first surface feature, and the first bend includes a second surface feature and a third surface feature.

26. The electronic device of claim 25, wherein the first, second, and third surface features are symmetrical about the first bend.

* * * * *